United States Patent [19]

Meslner et al.

[11] Patent Number: 4,647,800
[45] Date of Patent: Mar. 3, 1987

[54] HIGH SPEED LOGIC APPARATUS

[75] Inventors: George J. Meslner, Acton; Peter N. Baum, Bedford, both of Mass.

[73] Assignee: GTE Laboratories Incorporated, Waltham, Mass.

[21] Appl. No.: 806,906

[22] Filed: Dec. 9, 1985

Related U.S. Application Data

[63] Continuation-in-part of Ser. No. 755,041, Jul. 15, 1985.

[51] Int. Cl.$^4$ .................... H03K 19/088; H03K 3/26
[52] U.S. Cl. .................................. 307/455; 307/270; 307/296 R; 307/317 A; 372/38
[58] Field of Search ............... 307/296 R, 317 A, 254, 307/455, 467, 270

[56] References Cited

U.S. PATENT DOCUMENTS

| | | | |
|---|---|---|---|
| 3,660,679 | 5/1972 | Ishigaki at al. ................ | 307/254 |
| 3,803,505 | 4/1974 | Ishigaki et al. ................ | 307/254 |
| 4,219,744 | 8/1980 | Shinn, II ...................... | 307/317 A |

Primary Examiner—Stanley D. Miller
Assistant Examiner—B. P. David
Attorney, Agent, or Firm—Fred Fisher

[57] ABSTRACT

A high speed laser driver includes a differential pair of bipolar transistors sharing a common emitter resistor as in the prior art. However, an improvement thereover resides in the use of Schottky barrier diodes, one of which couples the emitter of one transistor to the common emitter resistor and the other of which couples the emitter of the other transistor to the common emitter resistor. Furthermore, separate resistors couple the emitters of both transistors to a voltage source so that the transistors are always conducting.

A high speed logic circuit includes a pair of input bipolar transistors, and a reference transistor, sharing a common emitter resistor as in the prior art. However, an important resides thereover in the use of Schottky barrier diodes that couple the emitters of the transistors to the common emitter resistor. Furthermore, separate resistors couple the emitters of the three transistors to a voltage source so that the transistors are always conducting. Schottky barrier diodes are used in the emitters of ECL logic circuits, substantially increasing switching speed.

6 Claims, 4 Drawing Figures

HIGH SPEED LOGIC APPARATUS

CROSS-REFERENCE TO RELATED APPLICATION

This application is a continuation-in-part of U.S. patent application Ser. No. 06-755,041, entitled "High Speed Laser Driver", filed 7/15/85 by the applicants hereof and assigned to the common assignee thereof, said '041 patent application being hereinafter referred to as "parent application".

BACKGROUND OF THE INVENTION

1. Field of the Invention

This invention relates to high speed apparatus including high speed digital logic circuitry. Accordingly, it is a general object of this invention to provide new and improved apparatus of such character.

2. General Background

Emitter-Coupled Logic (ECL) circuits are commonly used in digital integrated circuitry. Disadvantageously, however, all commercially available, standard ECL logic families, presently, are limited to speeds under 1 Gb/s.

SUMMARY OF THE INVENTION

Another object of this invention is to provide a new and improved high speed digital logic circuit in which significantly higher switching speeds than the prior art can be achieved with transistors remaining conducting within their optimum performance range, while switching currents of sufficient amplitude to properly switch the output transistor.

In accordance with one aspect of the invention, an improvement is provided in a logic circuit having a first input transistor having one electrode adapted to be coupled to a point of reference potential, a second electrode, and a control electrode adapted to receive a first input signal ranging from one voltage leve to a second voltage level. A second input transistor has one electrode adapted to be coupled to the same point of reference potential, a second electrode, and a control electrode adapted to receive a second input signal ranging from the one voltage level to the second voltage level. A serial circuit includes an impedance adapted to be coupled to that same point of reference potential, and a reference transistor having one electrode coupled to the impedance. The reference transistor has a second electrode, and a control electrode adapted to be coupled to a bias level between the one level and the second level. A first resistor has a first terminal adapted to be coupled to a third voltage level. First means couple the second electrode of the first input transistor to a second terminal of the first resistor. Second means couple the second electrode of the second input transistor to the second terminal of the first resistor. Also, third means couple the second electrode of the reference transistor to the second terminal of the first resistor. The improvement in the logic circuit is provided by including a first high speed diode in the aforesaid first means, including a second high speed diode in the aforesaid second means, and including a third high speed diode in the aforesaid third means. The improvement further includes individual resistors that couple the second electrodes of the three transistors to the third voltage level.

In accordance with certain features of the invention, the transistors can be of the same conductivity type and each high speed diode is a Schottky barrier diode. The transistors can be bipolar n-p-n semiconductor transistors, wherein each transistor can have its own independent collector, emitter and base electrodes. A first high speed diode has an anode coupled to the emitter of the first transistor; a second high speed diode has an anode coupled to the emitter of the second transistor; and a third high speed diode has an anode coupled to the emitter of the reference transistor. Cathodes of the high speed diodes are coupled to each other. All the foregoing elements can be monolithically formed on a semiconductor integrated circuit chip.

In accordance with yet another aspect of the invention, a logic circuit includes three n-p-n bipolar transistors, each having a collector, a base, and emitter. The collectors of the first and the second transistors are adapted to be coupled to a point of reference potential. The bases of the first and second transistors are adapted to receive a first input signal, and a second input signal, respectively, ranging from one voltage level to a second reference level. The collector of the third transistor is coupled through an impedance to the point of reference potential. The base of the third transistor is adapted to be coupled to a bias level between the one voltage level and the second voltage level. A common resistor has one terminal adapted to be coupled to a third voltage level. An anode of a first Schottky barrier diode is coupled to the first transistor emitter; an anode of a second Schottky barrier diode is coupled to the second transistor emitter; and an anode of a third Schottky barrier diode is coupled to the third transistor emitter. The cathodes of all of the Schottky barrier diodes are coupled together and to a second terminal of the common resistor. Individual resistors respectively couple the emitters of the three transistors to the third voltage level.

In accordance with certain features of the invention, all of the foregoing recited elements are formed monolithically on an integrated semiconductor circuit chip.

BRIEF DESCRIPTION OF THE DRAWINGS

Other objects, advantages, and features of this invention, together with its construction and mode of operation, will become more apparent from the following description, when read in conjunction with the accompanying drawings, in which.

GENERAL DESCRIPTION

Figure 1:
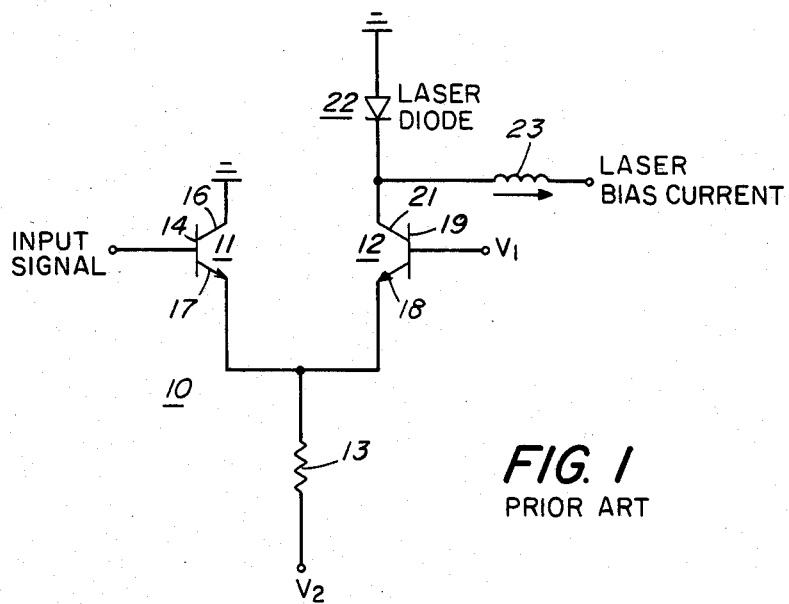
FIG. 1 is a circuit diagram of a prior art laser driver.

FIG. 1 depicts a typical laser driver 10 including a differential pair of bipolar transistors 11, 12 sharing a common emitter resistor 13. The input signal, typically ranging from −1.8 volts to −2.6 volts, would be applied to the base 14 of the bipolar n-p-n transistor 11. The collector 16 would be coupled to a point of reference potential, such as ground. The emitter 17 of the transistor 11 and the emitter 18 of the transistor 12 are coupled together through the resistor 13 to a voltage source $V_2$ which typically may be −5 volts. By way of example, the resistor 13 has a value of 33 ohms. The base 19 of the n-p-n transistor 12 is coupled to a voltage source $V_1$, which typically is $-2.2$ volts. The collector 21 of the transistor 12 is coupled to a cathode of the laser diode 22 whose anode is coupled to a point of reference potential such as ground. Laser bias current is provided to the laser diode 22 through a circuit which includes an inductor 23. Current applied to the inductor 23 may range from 25 to 50 mA, by way of example.

In operation, with a conventional driver 10, dc current is applied to the laser diode 22 through the inductor 23, biasing the laser diode 22 usually just above lasing threshold. When the input signal that is applied to the base 14 of the transistor 11 is more positive than the voltage $V_1$ that is applied to the base 19 of the transistor 12, the base 19/emitter 18 junction of the transistor 12 is reversed biased, cutting off the transistor 12. All of the current flowing through the resistor 13 passes through the transistor 11. When the input signal that is applied to the base 14 of the transistor 11 changes to become more negative than $V_1$, the transistor 11 turns off and the transistor 12 turns on, causing all of the current that flows through the resistor 13 to be applied to the laser diode 22. However, there is typically a 250 to 500 ps delay between the time the input signal goes negative and the time the transistor 12 turns completely on, limiting the rate at which the laser diode 22 can be modulated to approximately 1 Gb/s.

THE NEW LASER DRIVER

Figure 2:
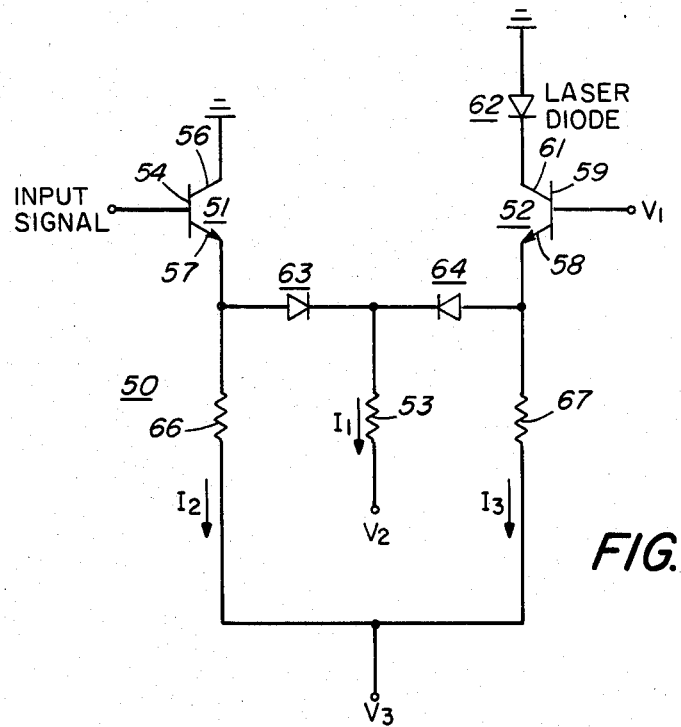
FIG. 2 is a circuit diagram of a high speed laser driver in accordance with the embodiment of the invention set forth in the parent application.

The new laser driver 50, in accordance with the preferred embodiment of the invention described in the parent application, as depicted in FIG. 2, is similar to the prior art circuit indicated in FIG. 1 with noted exceptions.

As depicted in FIG. 2, our new driver circuit 50 includes a differential pair of bipolar transistors 51, 52. The input signal can be applied to the base 54 of the transistor 51 whose collector 56 is coupled to a point of reference potential, such as ground. The transistor 51 has an emitter 57.

The transistor 52 has an emitter 58, a base 59 which is adapted to be coupled to the control voltage $V_1$ and a collector 61 which is adapted to be coupled to a cathode of the laser diode 62. The anode of the laser diode 62 is coupled to a point of reference potential, such as ground.

It is noted that the circuit as depicted in FIG. 2 does not include an inductor for biasing the laser diode 62. The emitter 57 of the transistor 51 is coupled to an anode of a Schottky barrier diode 63. The emitter 58 of the transistor 52 is coupled to the anode of a Schottky barrier diode 64. The cathodes of the Schottky barrier diodes 63, 64 are coupled together to a resistor 53 which, in turn, is coupled to a voltage level $V_2$.

The voltage level $V_2$ may range from $-3$ to $-5$ volts. By way of example, the resistor 53 can be 33 ohms. The voltage $V_1$ can be $-2.2$ volts and the input signal as applied to the base 54 may be $-1.8$ to $-2.6$ volts.

Further, the emitter 57 of the transistor 51, in addition to being coupled to the anode of the diode 63, is coupled through a resistor 66 to a voltage source $V_3$. Similarly, the emitter 58 of the transistor 52 is coupled through a resistor 67 to the voltage source $V_3$. The voltage source $V_3$ may range from $-3$ to $-5$ volts. Typically, the resistance values of the resistors 66, 67 may be 51 ohms each. For sake of illustration, the current traveling through the resistor 53 is designated $I_1$, the current traveling through the resistor 66 is $I_2$, and the current traveling through the resistor 67 is $I_3$.

The new laser driver 50, as shown in FIG. 2, is similar to the conventional circuit shown in FIG. 1, except that when the input signal applied to the base 54 of the transistor 51 is more positive than the voltage level at the base 59 of the transistor 52, the diode 63 conducts and the diode 64 is turned off. All of the current flowing through the resistance 53 flows through the diode 63 and the transistor 51, and none through the diode 64. That is, the current flowing through the transistor 51 is equal to $I_1$ plus $I_2$. The transistor 52, however, still conducts the current $I_3$ which also flows through the laser diode 62. This current is set to a value which biases the laser 62 just above lasing threshold. When the input signal goes negative, the diode 63 turns off and the diode 64 turns on, switching the current $I_1$ to the laser diode 62 via the diode 64 and the transistor 52. The bipolar transistor 51 does not turn off but remains conducting at the value of the current $I_2$. By using Schottky barrier diodes for the diodes 63, 64, switching actually takes place very quickly. As the transistors 51, 52 are always operating within their optimum operating region, fast switching time and high speed operation are virtually guaranteed. This new circuit still incorporates all of the good features of the conventional laser driver including independent control over laser modulating and biasing currents, laser isolation, and accurate control of the modulating current shape without the speed limitations of the conventional design.

In general, with this new high speed laser driver, the two transistors conduct at all times, the two diodes are switched on and off, respectively. Normally, the current $I_3$ is sufficient to keep the laser diode 62 biased above threshold. When the current $I_1$ is added to the current $I_3$, which represents the modulation, the high current level goes through the laser 62. When all the current $I_1$ flows through the transistor 51, that represents the low current level through the layer 62, which is still above threshold. When the input signal at the base 54 of the transistor 51 is more positive than the voltage level at the base 59 of the transistor 52, the emitter 57 of the transistor 51 is more positive than the emitter 58 of the transistor 52. Therefore, the diode 63 turns on and the diode 64 turns off. The currents $I_1$ and $I_2$ both flow through the transistor 51. The only current that flows through the transistor 52 is $I_3$, which is the current required to keep the laser slightly above threshold, which is the low output level from the laser. When the input signal at the base 54 goes negative with respect to the voltage applied to the base 59 of the transistor 52, the emitter 57 of the transistor 51 goes more negative than the emitter 58 of the transistor 52. The diode 63 turns off, the diode 64 turns on, and the current that flows through the transistor 52 becomes $I_1$ plus $I_3$, which is the high current level through the laser. Thus, modulation is obtained by causing the current $I_1$ to travel alternately through the diode 63 or 64 depending upon whether or not a 1 or a 0 is transmitted.

To achieve the foregoing desired results, Schottky barrier diodes are preferred due to their high speed, fast turn on and fast turn off times.

With the new and improved circuitries indicated herein, the rate at which the laser can be modulated is in excess of 3 Gb/s, as compared to about 1 Gb/s of the prior art circuitry indicated hereinabove.

Although n-p-n microwave transistors are preferred, due to their high speed which operate at about 25 or 30 mA, this invention is not limited thereto. Conceptually, p-n-p type transistors can be used with minor modifications, such as by reversing the laser diode; n-p-n type transistors are preferred due to their high speeds and comparative ease of fabrication.

In the prior art circuit hereinabove, a pair of transistors were used in which one transistor conducts and the other transistor is non-conductive. There was a significant time delay in switching the transistors on and off, whereas with the novel invention described herein, the new and improved circuit utilizes a pair of transistors which are always conducting, although they may be conducting at a low rate and a high rate. With this instant invention, there is a pair of opposed diodes in the emitter circuit which are coupled through a common resistor to a modulation control voltage where the diodes are switched on and off, one diode being switched on while the other one is being switched off, alternately back and forth. This invention takes advantage of the state of the art in that diodes can be turned on and off much faster than transistors can be turned on and off, especially through the use of Schottky barrier diodes.

Advantages of this new and improved circuit include fast switching of the modulating current not normally obtainable with other current mode switching circuits of the prior art. Another advantage is that very good independent control of both the bias and the modulating current is obtainable, making the circuitry quite flexible for use.

Logic Circuitry

Figure 3:
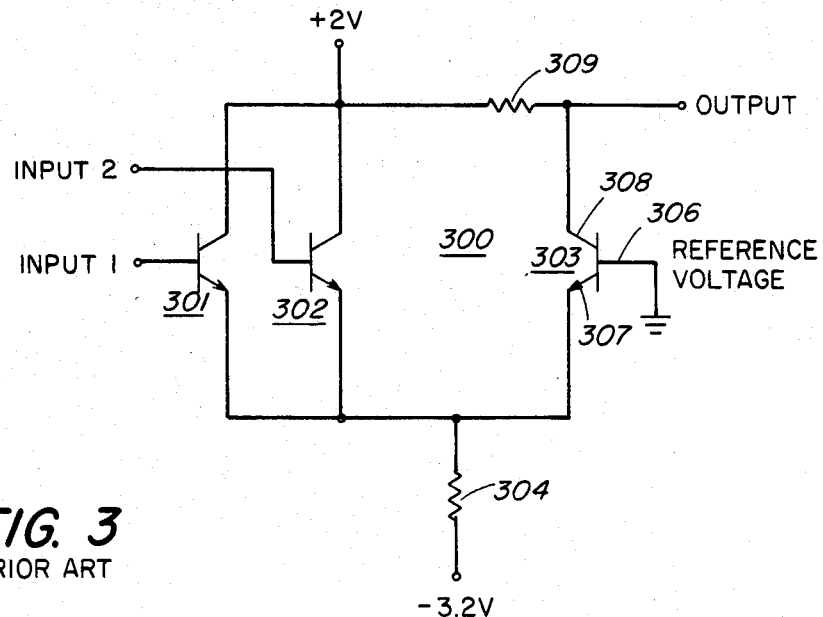
FIG. 3 is a circuit diagram of a prior art logic circuit.

FIG. 3 illustrates a basic prior art logic circuit 300 (an OR circuit) employed in most ECL families. It consists of input transistors 301 and 302 and a reference transistor 303 connected to a common current source (resistor 304 connected to a −3.2 V supply). (In commercial ECL circuits, a biased transistor is often used in place of the resistor 304.) The base 306 of the reference transistor 303 is connected to a reference voltage (GND) which is half way between the logic 1 and logic 0 input levels. When either input 1 or input 2 is high (logic 1) compared to the reference voltage, the emitter 307 of the transistor 303 is reversed bias, turning the transistor 303 off, causing the output (collector 308 of the transistor 303) to go high (logic 1 state). If both inputs are low (logic 0), the transistors 301 and 302 turn off and transistor 303 turns on, all of the current in the resistor 304 flows through the transistor 303, and the output across a serial resistor 309 goes low (logic 0). There are other circuits which are added to the basic circuit to ensure proper input and output voltages which are not shown in FIG. 3.

When bipolar transistors are turned off, switching speed is reduced. Significant improvement in speed can be realized when all transistors remain active.

THE NEW LOGIC CIRCUIT

Figure 4:
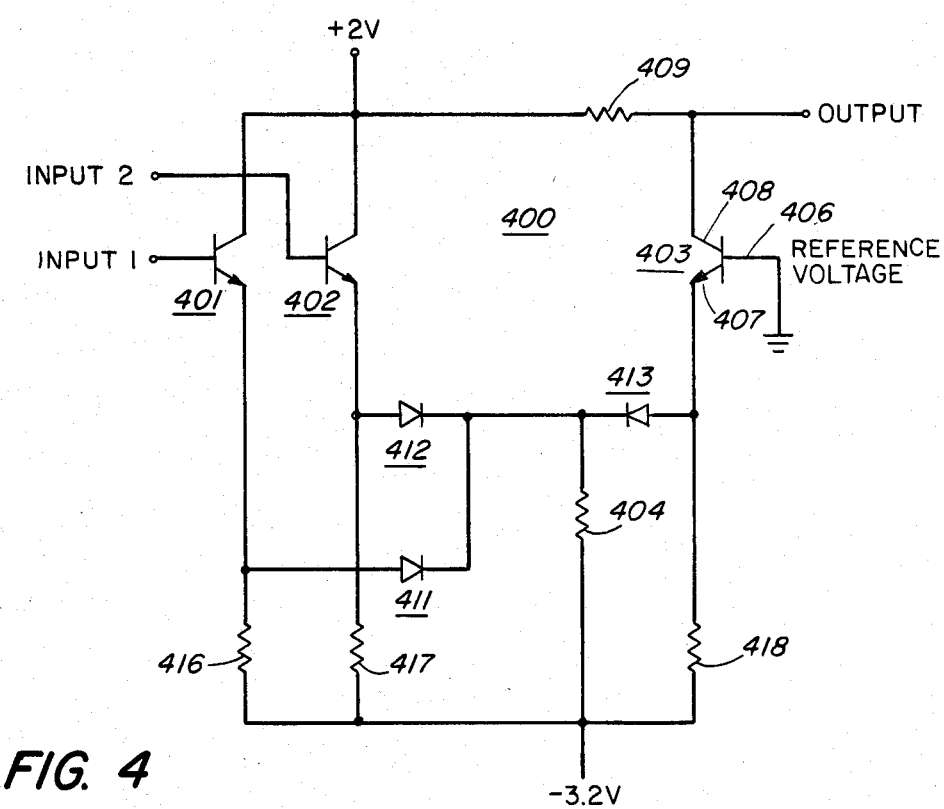
FIG. 4 is a circuit diagram of a high speed logic circuit in accordance with one embodiment of the invention.

The new logic circuit 400, in accordance with a preferred embodiment of this invention, as depicted in FIG. 4, is similar to the prior art circuit indicated in FIG. 3 with noted exceptions.

FIG. 4 shows the new high speed logic circuit 400. It is identical to the standard ECL circuit 300 with the addition of three Schottky barrier diodes 411, 412, 413 having their anodes coupled respectively to the emitters of the three transistors 401, 402, 403; also three resistors 416, 417, 418 are coupled respectively between the emitters of the three transistors 401, 402, 403 and the −3.2 voltage level. When either input 1 or input 2 is high, the diode 413 is back biased, and the current flowing through the resistor 404 is diverted to either the transistor 401 or 402 via the diode 411 or 412, respectively, reducing the current in the transistor 403. The transistor 403 remains conducting at a current level determined by the resistor 418. This level of current causes the output of the transistor 403 to equal the high or logic 1 level. When the inputs to the transistors 401 and 402 are low, the diodes 411 and 412 become back biased, the diode 413 becomes forward biased, and the current flowing through the transistor 403 increases by a value determined by the resistor 404. This increase in the transistor collector 408 current causes the voltage to drop or go to the logic 0 state. The diodes 411, 412, and 413 switch very quickly, even when reversed biased. The transistors 401, 402, 403 also switch quickly, since they are always biased within their optimum current region. Operating bipolar transistors in this manner greatly increases the speed of ECL circuits.

Various modifications can be performed with this invention without departing from the spirit and scope thereof. For example, the circuit can be incorporated in a monolithically formed integrated circuit. Various elements, including resistors, can be formed in integrated circuit chips.

What is claimed is:

1. In a logic circuit including
   a first input transistor having one electrode adapted to be coupled to a point of reference potential, a second electrode, and a control electrode adapted to receive a first input signal ranging from one voltage level to a second voltage level;
   a second input transistor having one electrode adapted to be coupled to said point of reference potential, a second electrode, and a control electrode adapted to receive a second input signal ranging from said one voltage level to said second voltage level;
   a serial circuit including an impedance and a reference transistor having one electrode coupled to said impedance, a second electrode, and a control electrode adapted to be coupled to a bias level between said one voltage level and said second voltage level; said impedance being adapted to be coupled to said point of reference potential;
   a first resistor having one terminal adapted to be coupled to a third voltage level, and a second terminal;
   first means coupling said second electrode of said first input transistor to said second terminal;
   second means coupling said second electrode of said second input transistor to said second terminal; and
   third means coupling said second electrode of said reference transistor to said second terminal, the improvement wherein
   said first means includes a first high speed diode,
   said second means includes a second high speed diode,
   said third means includes a third high speed diode, and wherein the improvement further comprises
   a second resistor for coupling said second electrode of said first transistor to said third voltage level;
   a third resistor for coupling said second electrode of said second transistor to said third voltage level; and
   a fourth resistor for coupling said second electrode of said reference transistor to said third voltage level.

2. The improvement as recited in claim 1 wherein said transistors are of the same conductivity type, and wherein each said high speed diode is a Schottky barrier diode.

3. The improvement as recited in claim 2 wherein all said transistors are bipolar n-p-n semiconductor transistors;

said one electrode, said second electrode and said control electrode of said first transistor are collector, emitter, and base electrodes, respectively;

said one electrode, said second electrode, and said control electrode of said second transistor are collector, emitter, and base electrodes, respectively;

said one electrode, said second electrode, and said control electrode of said reference transistor are collector, emitter, and base electrodes, respectively, and said first high speed diode has an anode coupled to said first transistor emitter, said second high speed diode has an anode coupled to said second transistor emitter, said third high speed diode has an anode coupled to said reference transistor emitter, and each of said high speed diodes having a respective cathode coupled to each other.

4. The improvement as recited in claim 1 wherein all recited elements are monolithically formed on a semiconductor integrated circuit chip.

5. A logic circuit comprising a first n-p-n bipolar transistor having a collector adapted to be coupled to a point of reference potential, a base adapted to receive a first input signal ranging from one voltage level to a second voltage level, and an emitter;

a second n-p-n bipolar transistor having a collector adapted to be coupled to said point of reference potential, a base adapted to receive a second input signal ranging from said one voltage level to said second voltage level, and an emitter;

an impedance having a first lead adapted to be coupled to said point of reference potential, and a second lead;

a third n-p-n bipolar transistor having a collector coupled to said second lead of said impedance, a base adapted to be coupled to a bias level between said one voltage level and said second voltage level, and an emitter;

a common resistor having one terminal adapted to be coupled to a third voltage level, and a second terminal;

a first Schottky barrier diode having an anode coupled to said emitter of said first transistor, and a cathode;

a second Schottky barrier diode having an anode coupled to said emitter of said second transistor, and a cathode;

a third Schottky barrier diode having an anode coupled to said emitter of said third transistor, and a cathode, said cathodes of all said Schottky barrier diodes being coupled together to said second terminal of said common resistor;

a second resistor for coupling said emitter of said first transistor to said third voltage level;

a third resistor for coupling said emitter of said second transistor to said third voltage level; and a fourth resistor for coupling said emitter of said third transistor to said third voltage level.

6. The logic circuit as recited in claim 5 wherein all recited elements are formed monolithically on an integrated semiconductor circuit chip.

* * * * *